United States Patent [19]

Eichenwald

[11] Patent Number: 4,675,547
[45] Date of Patent: Jun. 23, 1987

[54] HIGH POWER TRANSISTOR BASE DRIVE CIRCUIT

[75] Inventor: Rolf Eichenwald, Setauket, N.Y.

[73] Assignee: Kollmorgen Technologies Corpn., Dallas, Tex.

[21] Appl. No.: 717,162

[22] Filed: Mar. 28, 1985

[51] Int. Cl.[4] .......................... H03K 3/26; H03K 3/33; H03K 3/42

[52] U.S. Cl. ........................... 307/270; 307/268; 307/255; 307/311; 307/300

[58] Field of Search .............. 307/270, 311, 253, 254, 307/300, 255, 268, 280

[56] References Cited

U.S. PATENT DOCUMENTS

| | | | |
|---|---|---|---|
| 3,787,738 | 1/1974 | Horwath | 307/268 |
| 4,032,834 | 6/1977 | Beierholm | 307/252 R |
| 4,399,500 | 8/1983 | Clarke et al. | 307/270 |
| 4,408,137 | 10/1983 | Fox | 307/311 |

Primary Examiner—Stanley D. Miller
Assistant Examiner—B. P. Davis
Attorney, Agent, or Firm—Morgan & Finnegan

[57] ABSTRACT

In a base drive circuit for a high power transistor, an external signal is applied to the circuit by an optical coupler. In response to the external signal, the circuit provides a positive current to the high power transistor in order turn it on. The positive constant current is characterized by an initial spike that prevents any localized hot spots from developing in the high power transistor and thereafter the positive current becomes constant. The circuit also provides a constant negative current when the external signal is removed, thereby quickly turning off the high power transistor. The optical coupler and a time delay device provide the circuit with high noise immunity.

4 Claims, 2 Drawing Figures

HIGH POWER TRANSISTOR BASE DRIVE CIRCUIT

Recently, high speed, power transistors have become available with the capability of, for example, switching power in the range above 20,000 watts in less than 5 microseconds. An example of such a transistor is the KD22457510, made by Westinghouse Electric Co. Although these transistors have been designed to potentially provide fast switching capability, the high speed operation often cannot be realized in many applications, particularly, if false triggering is to be avoided and fault protection is to be provided.

One of the problems encountered with the fast switching transistors is the increased sensitivity to noise and spurious triggering signals. Slower transistors, due to their slow response to input signals, have a corresponding immunity from short noise signals. The faster switching transistors, however, can respond to relatively short spurious noise pulses and, hence, have a much greater noise sensitivity.

These problems cannot be overcome by simply reducing the drive current to reduce the switching speed since, during the initial turn-on of the transistor, this can result in a non-uniform current spread throughout the die resulting in undesirable concentration of high current and hot spots. Attempts at solving this problem by simply increasing the base current drive to a higher level to provide a faster turn-on can, on the other hand, easily destroy the transistor under partially conductive fault conditions.

An object of this invention is to provide a base drive circuit for high power, fast switching transistors, that permits effective operation at high switching rates.

Another object of the invention is to provide a base drive circuit for power transistors having a high noise immunity in both the on and off conditions.

A still further object of the present invention is to provide negative base current for turning off quickly the power transistor when faults occur or for turning off quickly the power transistor to minimize switching times and switching losses during normal switching.

Still another object of the invention is to provide a base drive circuit for power transistors with a fast turn-on capability that avoids formation of hot spots in the transistor and which also protects the transistor during partially conductive fault conditions.

SUMMARY OF THE INVENTION

The transistor base drive current for the power switching transistor must be sufficient in the "on" condition so as to maintain the transistor in the saturated or fully conductive state throughout the entire range of load currents being supplied by the transistor. A high base current is also desirable during the turn-on period so that the current is supplied quickly and spreads uniformly throughout the die to eliminate concentration of currents and consequent hot spots. On the other hand, high base current can easily destroy the transistor under fault conditions that require high power dissipation under partially conductive conditions. With the base drive circuit according to the invention the base current is supplied by a constant current regulator with an initial, short interval, high current override. In the quiescent "on" state, the constant current regulator maintains the power transistor base current at a level high enough to maintain the transistor in saturation throughout the range of anticipated load currents but, at the same time, low enough to prevent high power loss damage under partially conductive fault conditions. The initial override provides a sufficiently high current to the base of the power transistor to force a rapid current spread over the die to avoid hot spots and provide rapid turn-on. The period of time during which initial high current is present, however, is sufficiently short that, even should a fault exist, the power dissipation is insufficient to destroy the transistor. With this base drive arrangement, noise immunity is provided using an optical coupler in combination with a time delay circuit to reduce sensitivity to spurious noise signals which might otherwise turn the transistor on. A continuous reverse current base drive is utilized to provide noise immunity during the off condition. The reverse base drive not only provides noise immunity, but also provides rapid turn-off, and as a consequence, reduces power losses under fault conditions to thereby add additional protection for the power transistor.

GENERAL DESCRIPTION OF THE DRAWINGS

The manner in which the foregoing and other objects are achieved according to the invention will become clear from the following specification which includes the drawings and wherein.

DETAILED DESCRIPTION OF THE INVENTION

Figure 1:
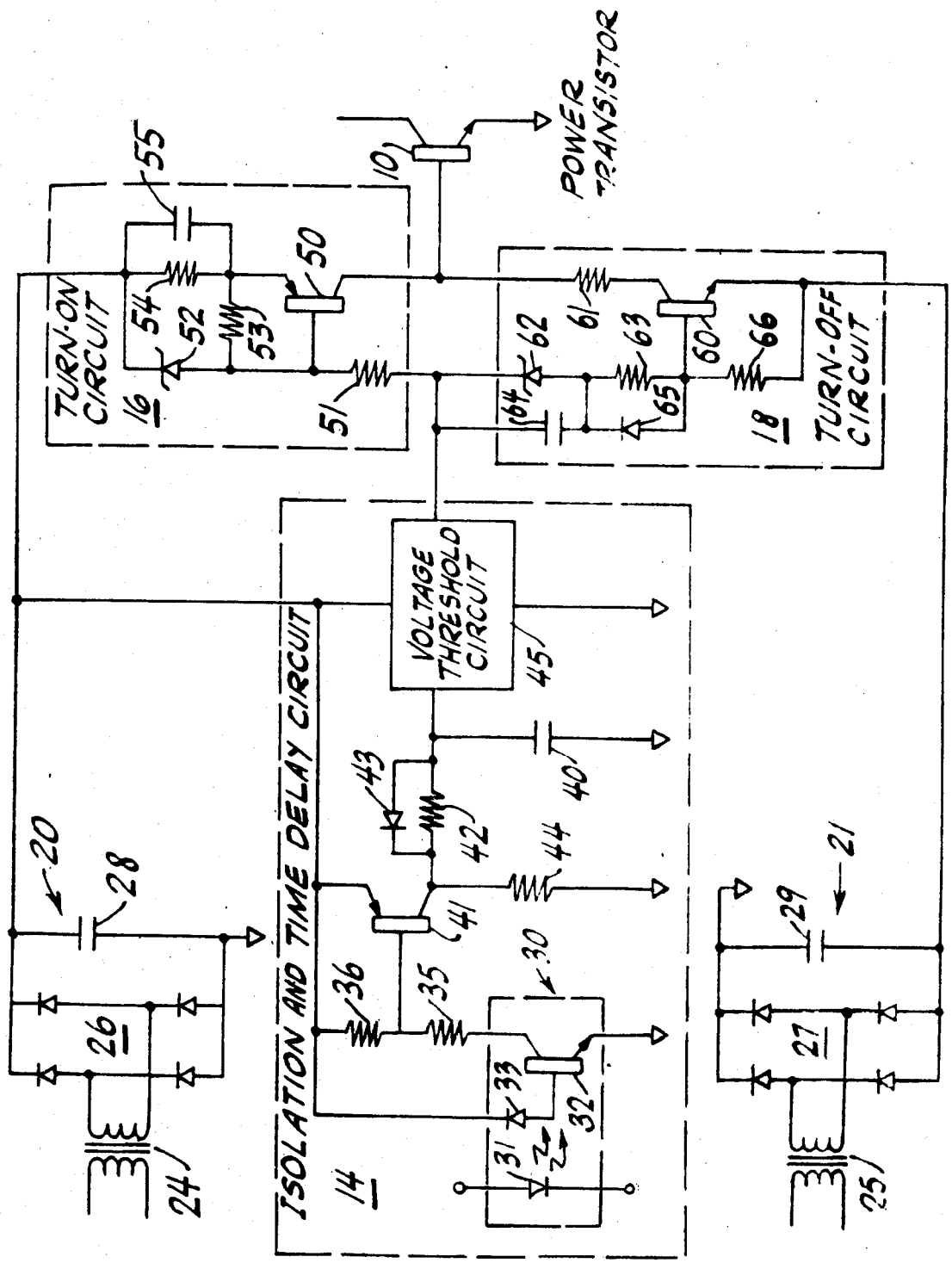
FIG. 1 is a schematic diagram illustrating the base drive circuit according to the invention.

The base drive circuit for a fast switching power transistor 10 is shown in FIG. 1 including an isolation and time delay circuit 14, a turn-on circuit 16 and turn-off circuit 18. The isolation and time delay circuit includes an optically coupled input circuit, which isolates the base drive circuit form the external circuits, and a time delay circuit designed to reduce sensitivity to short spurious noise signals. Turn on circuit 16 is a constant current regulator which normally provides a pre-determined constant current to the base of transistor 10 at a level sufficient to maintain the power transistor in saturation under all anticipated load conditions and, at the same time, insufficient to permit damage to the transistor under partially conductive conditions which may occur during faults. The turn-on circuit further includes a current override to provide a short initial high current to rapidly turn-on the transistor so as to avoid high current concentrations in the transistor die which may create hot spots. Turn-off circuit 18 provides a continuous reverse current to the base of the power transistor 10 to rapidly turn off the transistor and to reduce noise sensitivity in the off state.

The base drive circuit is powered from two isolated power supplies 20 and 21 which provide a positive and a negative source, respectively. The power supplies include transformers 24 and 25 having primary windings connected to an AC source and secondary windings connected to diode bridges 26 and 27, respectively, arranged in full wave bridge configurations. Filter capacitors 28 and 29 are connected across the outputs of the diode bridges. The negative plate of capacitor 28 and the positive plate of capacitor 29 are connected to the common for the base drive circuit. Thus, power supply 20 on the other plate of capacitor 28 provides a positive source whereas power supply 21 on the other plate of capacitor 29 provides a negative source.

Isolation and time delay circuit 14 includes an optically coupled input circuit followed by a time delay circuit which reduces sensitivity to short noise signals. The input circuit includes a light emitting diode (LED) 31 in a light tight enclosure 30 with a photo sensitive transistor 32. LED 31 is connected to the external circuit and receives the signals for controlling the state of the power transistor 10. Current flow through diode 31 causes the diode to emit light which, in turn, renders transistor 32 conductive. The base of transistor 32 is connected to the positive source via a diode 33. The collector of transistor 32 is connected to the positive source via resistors 35 and 36 in series whereas the emitter of the transistor is connected to the common. Thus, current flow through light emitting diode 31 renders transistor 32 conductive which in turn causes current flow through resistors 35 and 36 developing a potential drop across the resistors.

The main timing element of the time delay circuit is capacitor 40. The charging circuit for the capacitor includes the emitter-base circuit of a PNP transistor 41 connected in series with a resistor 42 between the positive source and ground. A diode 43 is connected across resistor 42 and is poled in a direction to provide a discharge path for capacitor 40 via a resistor 44 connected between the collector of transistor 41 and the common. A voltage threshold circuit 45, such as integrated circuit 555N, is connected across capacitor 40 and responds to the voltage across the capacitor. When the potential supplied to the input of voltage threshold circuit 45 reaches approximately two thirds of the supply voltage, the threshold circuit turns on and the output thereof goes from high to zero.

When the potential across resistor 36 becomes sufficiently high due to the signal applied to LED 31 and the conductivity of transistor 32, that potential renders transistor 41 conductive which, in turn, permits current flow through the charging circuit including the emitter-base of transistor 41 and resistor 42 to charge capacitor 40. If the input signal maintains transistors 32 and 41 sufficiently long for the potential across capacitor 40 to reach the threshold potential of voltage threshold circuit 45, the output of the threshold circuit becomes zero to, in turn, render the power transistor conductive. When transistor 41 becomes non-conductive capacitor 40 rapidly discharges via diode 43 and resistor 44. Thus, only input signals of sufficient duration to overcome the time delay can activate the power transistor and, hence, spurious noise signals of a lesser duration have no effect on the base drive circuit.

The output of voltage threshold circuit 45 is coupled to the base of a PNP type transistor 50 via a resistor 51. The base of transistor 50 is also connected to the anode of a zener diode 52 with the cathode thereof connected to the positive source. The emitter of transistor 50 is connected to the positive source via a resistor 54 having a capacitor 55 connected in parallel therewith. A resistor 53 is connected between the emitter and base of transistor 50.

If capacitor 55 were removed from circuit, the remaining components would function as a constant current regulator. The amount of current flowing through transistor 50 is equal to the voltage across the zener diode minus the emitter-base voltage of the transistor as developed across resistor 53 divided by the resistance value for resistance 54. When transistor 50 is initially rendered conductive by a positive signal applied via resistor 51, capacitor 55 charges to provide a high initial current flow through transistor 50 into the base of the power transistor. The initial high current flow decays exponentially as capacitor 55 charges and eventually settles at the constant current value determined by zener diode 52.

Turn-off circuit 18 includes an NPN transistor 60 which couples the base of the power transistor to the negative source to apply a continuous negative voltage during the off condition. The collector of transistor 60 is connected to the base of power transistor 10 via a resistor 61, whereas the emitter of transistor 60 is coupled directly to negative source 21. The output of voltage threshold circuit 45, which controls the conductive state of power transistor, is coupled to the cathode of a zener diode 62 with the anode thereof being coupled to the base of transistor 60 via a resistor 63. A capacitor 64 is connected in parallel with zener diode 62 and a diode 65 is connected in parallel with resistor 63. A resistor 66 is connected across the base emitter circuit of transistor 60.

Zener diode 62 provides a voltage offset to the base of transistor 60 so that, when the output of voltage threshold circuit 45 is zero (the condition which renders the power transistor 10 conductive), the zener potential maintains the base of transistor 60 at zero volts relative to the emitter thereof so that transistor 60 remains non-conductive. When the output of voltage threshold circuit rises to the positive value (the condition which turns power transistor 10 off), the voltage offset provided by zener diode 62 and resistor 63 permits a similar rise in the potential at the base of transistor 60 thereby rendering that transistor conductive. The series circuit including capacitor 64 and diode 65 permits a faster transient response when transistor 60 is turned off to provide a rapid turn-on for the power transistor.

Figure 2:
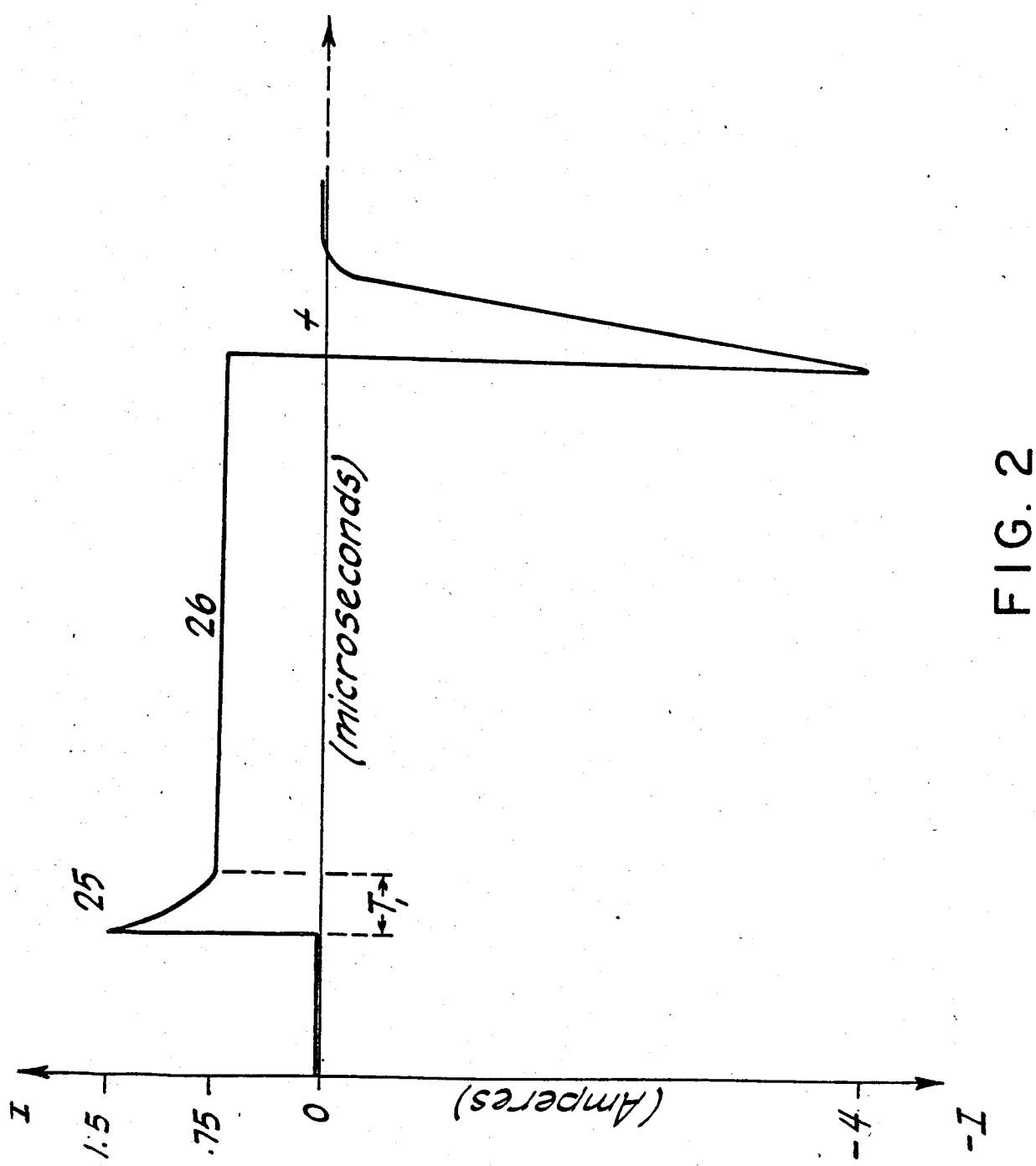
FIG. 2 is a curve illustrating the character of the base drive current.

The operation of the base drive circuit according to the invention can best be understood in connection with FIG. 2 which is a curve illustrating the base current of the power transistor through a normal operating cycle. Initially, there is no external signal applied to LED 31 and therefore transistor 32 is non-conductive. The voltage threshold circuit 45 provides a positive output signal which maintains transistor 50 of turn-on circuit 16 in the non-conductive state and causes transistor 60 in the turn-off circuit to conduct. Current therefore flows from the base of power transistor 10 through resistor 61 and the collector-emitter circuit of transistor 60 to the negative source provided by power supply 21. The continuous reverse voltage from the phase of the power transistor maintains the power transistor in a non-conductive state. The reverse base drive provides protection against spurious noise since any such noise signals must overcome the negative drive on the phase in order to falsely trigger the power transistor into a conductive state.

When an external signal is applied to LED 31, photo transistor 32 conducts which in turn renders transistor 41 conductive to commence charging a capacitor 40. If the signal applied to the LED remains sufficiently long, the charge on capacitor 40 builds up and exceeds the threshold value of voltage threshold circuit 45. When the threshold value is exceeded the output of circuit 45 drops to zero which in turn renders transistor 60 non-conductive thereby terminating the negative base. The zero potential at the output circuit 45 is coupled to the base of transistor 50 and renders this transistor in turn-on circuit 16 conductive. The charge of capacitor 50 provides a high initial current at point 25 in FIG. 2. The current supplied to the base of transistor 10 decays exponentially as capacitor 55 charges. After a short period $t_1$ the value of the base current supplied to the power transistor reaches the level 26 shown in FIG. 2 and is thereafter maintained at this level by the constant current circuit configuration provided by zener diode 52 in the emitter-base circuit of transistor 50.

Termination of the signal applied to LED 31 turns off the LED, renders transistors 32 and 41 non-conductive and therefore capacitor 40 discharges via diode 43 and resistor 44. The potential cross capacitor 40 drops rapidly and therefore voltage thresholds circuit once again provides a positive output signal which renders transistor 50 nonconductive and renders transistor 60 conductive. When transistor 60 becomes conductive, the base of the power transistor is connected to the negative source providing a reverse current base drive which rapidly clears out the carriers in the power transistor and assists in rapidly turning the transistor off.

The constant current level 26 for the positive base drive which renders the power transistor conductive is selected to a value sufficiently high to maintain the power transistor in a fully conductive saturated state for all anticipated load current conditions. The current regulator is set so that the base current is maintained at a maximum level below that which would permit destruction of the power transistor in a fault state where a high current may be encountered. The fault state could include a short or ground at the external load. By limiting the base current of the power transistor, the power dissipation in the conductive state is limited so that the power transistor is not destroyed.

Specific parameters for a specific power transistor namely the Westinghouse Electric Co. KD22457510 transistor are as follows:
 regulated positive drive current=0.75 amperes
 initial drive current=1.5 amperes
 time interval $t_1$=1 microsecond
 negative drive current=4 amperes While only one specific embodiment of the invention has been disclosed in detail, there obviously are numerous variations within the scope of this invention. The invention is more particularly defined in the appended claims.

I claim:

1. A base drive circuit for a fast switching, power transistor comprising:
 an input circuit responsive to external transistor turn-on commands;
 a constant current regulator for normally supplying a base drive to the power transistor in response to a turn-on command at a level,
  sufficiently high to maintain the power transistor in the fully conductive state for all anticipated currents, and
  below the level where power dissipation in the power transistor would be destructive in a fault state, and;
 an override circuit coupled to said current regulator to momentarily override said constant current to provide a high initial base current to the power transistor to rapidly turn on the power transistor, said high initial base current being for a duration sufficiently long that the current spreads evenly throughout the power transistor.

2. A base drive circuit according to claim 1 further comprising a turn-off circuit coupled to the base of the power transistor to provide a reverse current whence the transistor is rendered non-conductive.

3. A base drive circuit in accordance with claim 1 wherein input circuit further includes a time relay circuit such that input signals of less than a predetermined duration are not effective to turn-on said power transistor.

4. A base drive circuit in accordance with claim 3 wherein said input circuit further includes an optical coupling circuit.

* * * * *